United States Patent [19]

Cushing et al.

[11] Patent Number: 5,229,999
[45] Date of Patent: Jul. 20, 1993

[54] METHOD AND APPARATUS FOR INTEGRITY TESTING OF FAULT MONITORING LOGIC

[75] Inventors: David Cushing, Chelmsford; Edward Hutchings, Brockton; Elmer W. Carroll, Billerica; James Bertone, Quincy, all of Mass.

[73] Assignee: Bull HN Information Systems Inc., Billerica, Mass.

[21] Appl. No.: 593,179

[22] Filed: Oct. 5, 1990

[51] Int. Cl.$^5$ ............................................. G01R 31/28
[52] U.S. Cl. ........................................ 371/3; 371/22.3
[58] Field of Search .................... 371/3, 22.3, 23, 22.6, 371/15.1, 21.1

[56] References Cited

U.S. PATENT DOCUMENTS

| | | | |
|---|---|---|---|
| 4,669,081 | 5/1987 | Mathews | 371/22.3 X |
| 4,779,271 | 10/1988 | Suzuki | 371/3 |
| 4,897,837 | 1/1990 | Ishihara | 371/22.3 |
| 4,972,414 | 11/1990 | Borkenhagen | 371/22.3 |
| 4,996,688 | 2/1991 | Byers et al. | 371/3 X |
| 5,001,712 | 3/1991 | Splett et al. | 371/3 |
| 5,043,990 | 8/1991 | Doi | 371/3 X |
| 5,058,112 | 10/1991 | Namitz | 371/3 |

OTHER PUBLICATIONS

P. Goel, "Testable Decoder Design for Decoder-Controlled Multiplexing Networks", IBMTDB, vol. 20, No. 9, Feb. 1978, pp. 3463-3465.

"Error-Handling Testing VIA Error Injection", IBMTDB, vol. 29, Jul. 1986, pp. 542-543.

"Test Logic for Error Checkers", IBMTDA, vol. 31, No. 12, May 1989, pp. 387-389.

Primary Examiner—Charles E. Atkinson
Attorney, Agent, or Firm—Gary D. Clapp; John S. Solakian

[57] ABSTRACT

In a data processing system, a data processing unit contains data processing logic including shadowed functional registers for storing the data being processed. The units also include fault monitoring logic, including, for each shadowed functional register, a shadowing copy register connected in parallel from the corresponding shadowed register to receive and store a copy of the data resident in the shadowed register. Test logic is connected from the shadowed and shadowing registers for comparing the data resident in the shadowed and shadowing registers and providing indications of possible faults in the data processing logic. The shadowed and shadowing registers are connected in a serial scan chain through a serial scan data path. The integrity of the fault monitoring logic is tested by serially shifting, or scanning, known test patterns of bits through the serial scan chain comprised of the shadowed registers and shadowing registers. A first set of patterns are selected so that the test patterns themselves should not induce any errors to appear to the comparison logic so long as the test logic is correct, so that any errors that are detected are due to a fault in the test logic. A second set of test patterns are selected to induce errors to appear as the patterns are shifted, bit by bit, through the scan chain. The first patterns thereby determine that there are not errors in the fault monitoring logic itself, and the second patterns that the fault monitoring logic is detecting errors correctly.

14 Claims, 4 Drawing Sheets

METHOD AND APPARATUS FOR INTEGRITY TESTING OF FAULT MONITORING LOGIC

Cross References To Related Patent Applications

The following patent applications and patents which are assigned to the same assignee as the present patent application have related subject matter:

1. Data Processing System Having a Bus Command Generated by One Subsystem on Behalf of Another Subsystem, invented by George J. Barlow, Arthur Peters, Richard C. Zelley, Elmer W. Carroll, Chester M. Nibby, Jr., and James W. Keeley, Ser. No. 944,052 filed Dec. 18, 1986, abandoned on Jun. 29, 1990 and continued as a first Continuation application Ser. No. 547,527 filed Jun. 29, 1990, which was in turn abandoned on Oct. 10, 1991 and continued as a second Continuation application Ser. No. 773,752 field Oct. 10, 1991.

2. Apparatus and Method of Loading A Control Store Memory of a Central Subsystem, invented by Richard C. Zelley, Mark J. Kenna, Jr., and Wallace A. Martland, Ser. No. 943,980, filed Dec. 18, 1986 and issued Apr. 3, 1990 as U.S. Pat. No. 4,914,576.

3. Apparatus and Method for Loading and Verifying A Control Store Memory of a Central Subsystem, invented by Chester M. Nibby, Jr., Richard C. Zelley, Kenneth E. Bruce George J. Barlow, and James W. Keeley, Ser. No. 943,984, filed Dec. 18, 1986 and issued Mar. 20, 1990 as U.S. Pat. No. 4,910,666.

4. Apparatus and Method of Loading Different Control Stores of a Multiprocessor to Provide a Multi-Personality System, Invented by Richard C. Zelley, Mark J. Kenna, Jr., and Wallace A. Martland, Ser. No. 943,985, filed Dec. 18, 1986, abandoned on Jan. 28, 1991.

5. Universal Peripheral Controller Self-Configuring Bootloadable Ramware, invented by John A. Klashka, Sidney L. Kaufman, Krzysztof A. Kowal, Richard P. Lewis, Susan L. Raisbeck and John L. McNamara, Jr., Ser. No. 925,431, filed Oct. 31, 1986 and issued Feb. 7, 1989 as U.S. Pat. No. 4,803,623.

6. System Management Apparatus for a Multiprocessor System, invented by George J. Barlow, Elmer W. Carroll, James W. Keeley, Wallace A. Martland, Victor M. Morganti, Arthur Peters and Richard C. Zelley, Ser. No. 869,164, filed May 30, 1986 and continued as Ser. No. 377,785, filed Jul. 6, 1989.

7. Memory System With Automatic Memory Reconfiguration, invented by Robert B. Johnson, Chester M. Nibby, Jr., and Edward R. Salas, Ser. No. 413,631, filed Sept. 3, 1982 and issued Mar. 26, 1985 as U.S. Pat. No. 4,507,730.

8. Memory Controllers With Burst Mode Capability, invented by Robert B. Johnson and Chester M. Nibby, Jr., Ser. No. 202,819, filed Oct. 31, 1980 and issued Dec. 28, 1982 as U.S. Pat. No. 4,366,539.

9. Resilient Bus System, invented by George J. Barlow and James W. Keeley, Ser. No. 717,201, filed Mar. 28, 1985 and issued Aug. 16, 1988 as U.S. Pat. No. 4,764,862.

10. Multiprocessor Shared Pipeline Cache Memory With Split Cycle and Concurrent Utilization, invented by James W. Keeley and Thomas F. Joyce, Ser. No. 655,473, filed Sept. 27, 1984 and issued Sept. 22, 1987 as U.S. Pat. No. 4,695,943.

BACKGROUND OF THE INVENTION

Field of Use

The present invention relates to fault monitoring of data processing elements in a data processing system and, in particular, to integrity testing of the fault monitoring logic.

Prior Art

A recurring problem in data processing systems is that of fault monitoring, that is, the detection and isolation of faults in the data processing logic. The problem arises from the complexity of the logic circuitry of data processing elements, which may contain thousands of individual logic circuits, such as registers, gates, multiplexers, adders, and so forth, and the complexity of the interconnections and operations performed by the data processing elements. A thorough test of every element and function or operation in a data processing unit may require, for example, hundreds of hours of system time. For this reason, it is usual that only certain functions and operations are checked in detail, usually at system initialization, and much fault monitoring is performed by logic which monitors the operations of the system during use.

The use of fault monitoring logic, however, induces further problems in that the fault monitoring logic itself may contain faults and in turn must be tested to insure its integrity. This fault monitoring logic itself, however, adds to the complexity of the logic contained in the data processing units and the testing of the fault monitoring circuitry can add significantly to the time and system resources needed to test the system.

The method and apparatus of the present invention addresses this and other problems of the systems of the prior art.

OBJECTS OF THE INVENTION

It is therefore an object of the present invention to provide an improved method and apparatus for testing the integrity of the fault monitoring logic of a data processing system.

It is a further object of the present invention to provide a method and apparatus for testing the integrity of the fault monitoring logic of a data processing system which requires the minimum additional logic elements and complexity to the data processing elements of the data processing system, and which requires the minimum time to test the integrity of the fault monitoring logic.

SUMMARY OF THE INVENTION

In the data processing system of the present invention, each data processing unit contains data processing logic which in turn includes shadowed functional registers for storing the data being processed. The system units also include fault monitoring logic for detecting faults in the data processing logic, the fault monitoring logic including, for each shadowed functional register, a shadowing copy register connected in parallel from the corresponding shadowed register to receive and store a copy of the data resident in the shadowed register. Test logic is connected from the shadowed and shadowing registers for comparing the data resident in the shadowed and shadowing registers and providing indications of possible faults in the data processing logic as indicated by differences between the data stored in the shadowed registers and the copies of the data stored in the shadow registers. In the present invention, the shadowed and shadowing registers are connected in a serial scan chain through a serial scan data path.

The integrity of the fault monitoring logic, that is, the shadow and comparison logic, is tested by serially shifting, or scanning, known test patterns of bits through the serial scan chain comprised of the shadowed registers and shadowing registers. There are two sets of test patterns. The first set of patterns are selected so that the test patterns themselves should not induce any errors to appear to the comparison logic so long as the the test logic is correct, so that any errors that are detected are due to a fault in the test logic. The second set of test patterns are selected to induce errors to appear as the patterns are shifted, bit by bit, through the scan chain. The first patterns thereby determine that there are not errors in the fault monitoring logic itself, and the second patterns that the fault monitoring logic is detecting errors correctly.

BRIEF DESCRIPTION OF THE DRAWINGS

The foregoing and other objects, features and advantages of the present invention will be apparent from the following description of the invention and embodiments thereof, as illustrated in the accompanying figures, wherein.

DESCRIPTION OF A PREFERRED EMBODIMENT

Figure 1:
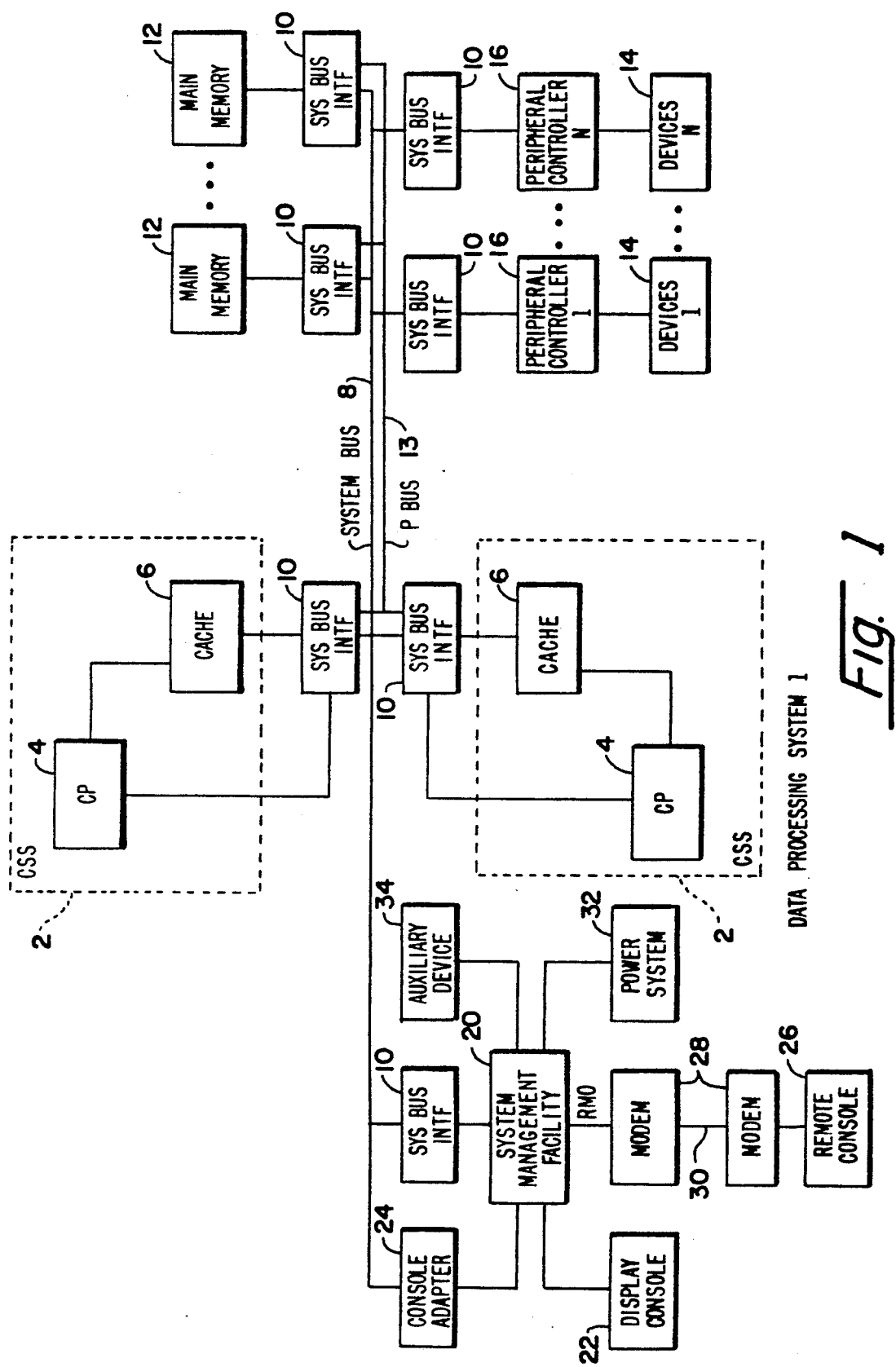
FIG. 1 is a block diagram of an exemplary system incorporating the present invention.

Referring to FIG. 1, therein is represented a block diagram of an exemplary system in which the present invention may be embodied. Data Processing System (DPS) 1 may be, for example, a DPS 6000 computer system from Bull HN Information Systems Inc. of Billerica, Mass. The following will describe the structure and operation of DPS 1 only briefly as such systems are generally well known and understood in the art and the exemplary system described specifically herein is described in detail in the previously referenced related patents.

As shown, multiprocessor Data Processing System (DPS) 1 includes a one or more functional units, including one or more Central Sub-Systems (CSSs) 2, each CSS 2 being comprised of a Central Processor (CP) 4 and a Cache 6. Each CP 4 and the Cache 6 of each CSS 2 have access to a System Bus (SYSBUS) 8 through a System Bus Interface (SBI) 10.

DPS 1's functional units include one or more Main Memories 12, which are shared by the CSSs 2 and which are each connected to System Bus 8 through a SBI 10. In addition to SYSBUS 8, DPS 1 includes a Private Bus (PBUS) 13 which is connected between each of Main Memories 12 and each of the CSSs 2 with the Main Memories 12 and the CSSs 2 being connected to PBUS 13 through SBIs 10. PBUS 13 is provided as a means from private, high speed data reads from Main Memories 12 to CSSs 2, while general purpose data transfers and memory write operations are performed through SYSBUS 8.

DPS 1 also includes Peripheral Devices (PDs) 14, such as disk and tape drives and communications devices. Each PD 14 is connected to System Bus 8 through a SBI 10 and an appropriate corresponding Peripheral Device Controller (PDC) 16.

Finally, DPS 1's functional units include a System Management Facility (SMF) 20 with associated system management devices. SMF 20 provides centralized control of DPS 1. Among the operations controlled by SMF 20 are initialization of the DPS 1 system, initialization and control of Quality Logic Testing, that is, system fault testing and detection, and loading of operating system and applications software into Main Memories 12 and CSSs 2. SMF 20 also controls certain overall system operations, including system timing, monitoring of errors and faults, and monitoring of system operating temperature and system power.

Associated with SMF 20 are a Display Console 22 connected to SMF 20, which allows direct communication between a user and DPS 1, and a Console Adapter 24 which provides communication between Display Console 22 and System Bus 8 through SMF 20. Communication between a remote user and DPS 1, for example, for remote diagnostics, may be provided in the same manner as Display Console 22 through a Remote Console 26, which is connected to SMF 20 through Modems 28 and a Communications Link 30. Finally, SMF 20 includes a connection to Power System sensors and controllers 32 and to such Auxiliary Devices 34 as a printer.

Figure 2:
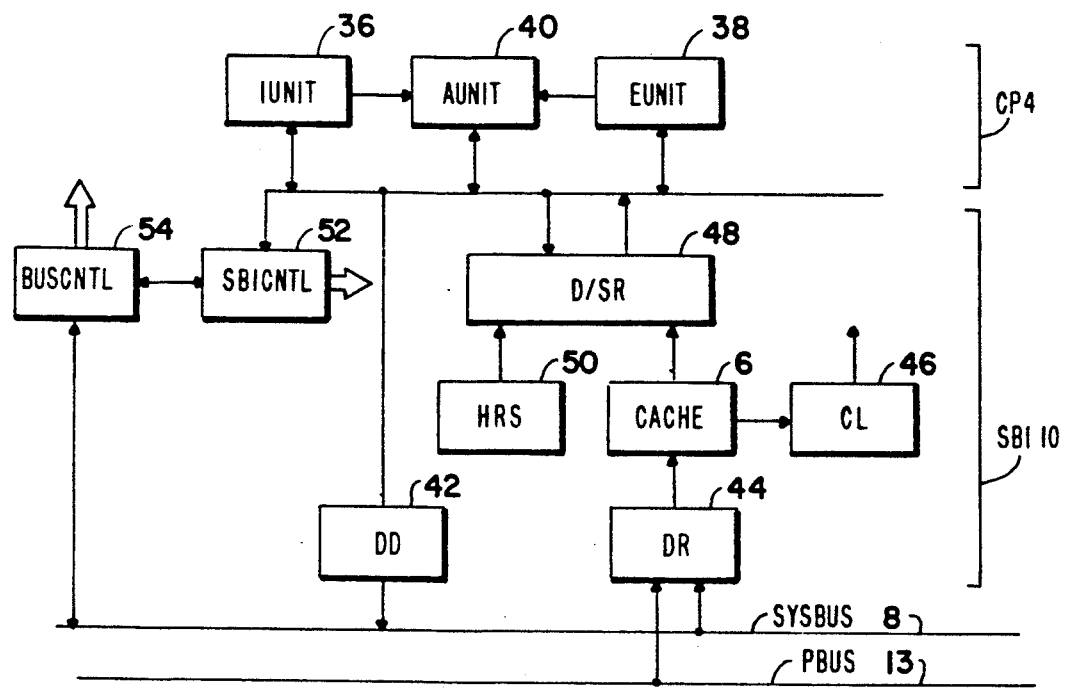
FIG. 2 is a block diagram of a central subsystem and bus interface unit of the exemplary system.

Referring to FIG. 2, therein is represented a simplified block diagram of a CSS 2 with those portions of a CSS 2 comprising CP 4 and SBI 10 being generally indicated by brackets.

First considering the CP 4, each CP 4 is comprised of an Instruction Unit (IUNIT) 36 which receives and decodes instructions to provide control outputs to the other elements of the CP 4, and Execute Unit (EUNIT) 38, which performs the actual data processing operations, and an Address Unit (AUNIT) 40, which is responsive to IUNIT 36 and EUNIT 38 to perform address translation functions and to control the reading and writing of data and instructions to and from MM 12 and CACHE 6. As the function and operation of processing unit elements such as IUNIT 36, EUNIT 38 and AUNIT 40 are well known and understood by those of ordinary skill in the art, these units will not be discussed in further detail herein. In addition, these units of the exemplary system are well described in the previously referenced related patents.

Referring to the SBI 10 related portions of the CSS 2, certain elements of SBI 10, such as CACHE 6, may in this and other systems be equally well regarded as a part of the CP 4 as the SBI 10, but is represented herein as part of SBI 10

An SBI 10 includes Data Drivers (DDs) 42, comprised of line drivers, for transferring information from the CP 4 and SBI 10 to System Bus 8 and Data Receivers (DRs) 44, comprised of line receivers, for receiving information from System Bus (SYSBUS) 8 and Private Bus (PBUS) 13.

In the system illustrated herein, the outputs of DRs 44 are connected into a Cache 6, which stores the information received from SYSBUS 8 and PBUS 13 for subsequent acceptance by the CP 4 or the functional logic of the SBI 10. In alternate embodiments, the element shown as Cache 6 may be implemented as a set of registers for receiving the data and instructions from SYS- BUS 8 and PBUS 13, or as a set of registers arranged as a First-In-First-Out (FIFO) memory, rather than as a full cache.

Cache 6 in turn provides outputs to Control Logic (CL) 46, which provides control outputs to the CP 4 to direct certain operations of the CP 4, for example, the loading of firmware into the CP 4 at system initialization. Cache 6 also provides outputs to Data/Interrupt-/Syndrome Registers (DIS) 48, which in turn provides data, interrupt commands and instructions, received from SYSBUS 8 and PBUS 13 and through Cache 6, to the CP 4. DIS 48 also receives and stores certain information from the CP 4, such as fault and status or "syndrome" information, for subsequent transmission to other units of DPS 1, such as SMF 20.

Associated in turn with DIS 48 is a Hardware Revision Store (HRS) 50 for storing information identifying the particular revision or configuration of the hardware comprising the CSS 2. As is described in the referenced related patents, this information is read from the HRS 50 of the CSS 2 by SMF 20 at system initialization to select the particular matching revision of the firmware controlling the operation of the CSS 2.

Finally, SBI 10 includes an SBI Control (SBICNTL) 52 containing the timing and logic functions necessary to control the operations of the SBI 10 and a Bus Control (BUSCNTL) 54 for controlling the operations of SBI 10 with respect to bus transfer operations between the SBI 10 or the CSS 2 and other units of DPS 1, such as SMF 20.

BUSCNTL 54 is responsible for controlling bus operations for both SBI 10 and CP 4 and provides access from SYSBUS 8 to many of the individual registers of SBI 10, IUNIT 36, EUNIT 38 and AUNIT 40. SMF 20, for example, may read from and write to many of the individual registers of the elements of CP 4 which are directly accessible through the pins of the integrated circuit chips. SMF 20 may in turn read and write many of the internal registers of these elements by using the internal data paths of IUNIT 36, EUNIT 38 and AUNIT 40.

When a particular bus operation involves the SBI 10, BUSCNTL 54 will interact with SBICNTL 52, providing the control and timing signals as necessary to direct SBICNTL 52 in controlling the operations of SBI 10 as necessary to execute the bus operation. If the bus operation involves the CSS 2, BUSCNTL 70 will interact in a similar manner with the control logic of the CSS 2 to execute the bus operation. Both BUSCNTL 70 and SBICNTL 68 are conventional and are described in further detail in the referenced related patents and accordingly their detailed designs will not be described further as such functions are familiar to those of ordinary skill in the art.

Briefly considering the bus operations executed by the units of DPS 1, as was previously described, the various units of DPS 1, such as SMF 20 and a CSS 2 may communicate through SYSBUS 8 by executing the protocols for bus transfer operations described in the previously referenced related patents. The various signals used in the bus transfer operations include address and data fields, for communicating, for example, the identity of a system unit with which is the recipient of a bus request, the address of a memory location or register within the unit which is to be read or written to, fields indicating the type of operation to be performed, for example, a read or write operation, and various control and handshake signals.

Each bus operation is executed in two phases. In the first, the system unit initiating the operation, referred to as the master unit for the operation, asserts the request by placing control and handshake signals on SYSBUS 8 to initiate the operation. These signals include signals indicating the type of operation to by performed and the address of the location within the system unit which is the target, or recipient of the request, referred to as the slave unit for the operation. The slave unit then responds to the request by either accepting the request or by refusing the request, for example, by refusing to acknowledge the request, by asking the master unit to wait, or by simply not responding. Assuming that the request is accepted, the actual data transfer takes place in the second phase.

The most basic form of bus operation, such as the transfer of a single data word, may be executed within a single bus cycle; the request is asserted and accepted in the first half cycle, that is, the first phase, and the data transfer, the second phase, being executed in the second half cycle. Other bus operations, for example, involving the transfer of multiple data words, may require several bus cycles.

It should be noted, with respect to bus operations, that BUSCNTL 54 also includes bus access arbitration logic which, when presented with conflicting requests for bus operations from two or more system units, resolves the requests to grant access to the requesting unit having the highest assigned priority.

Figure 3:
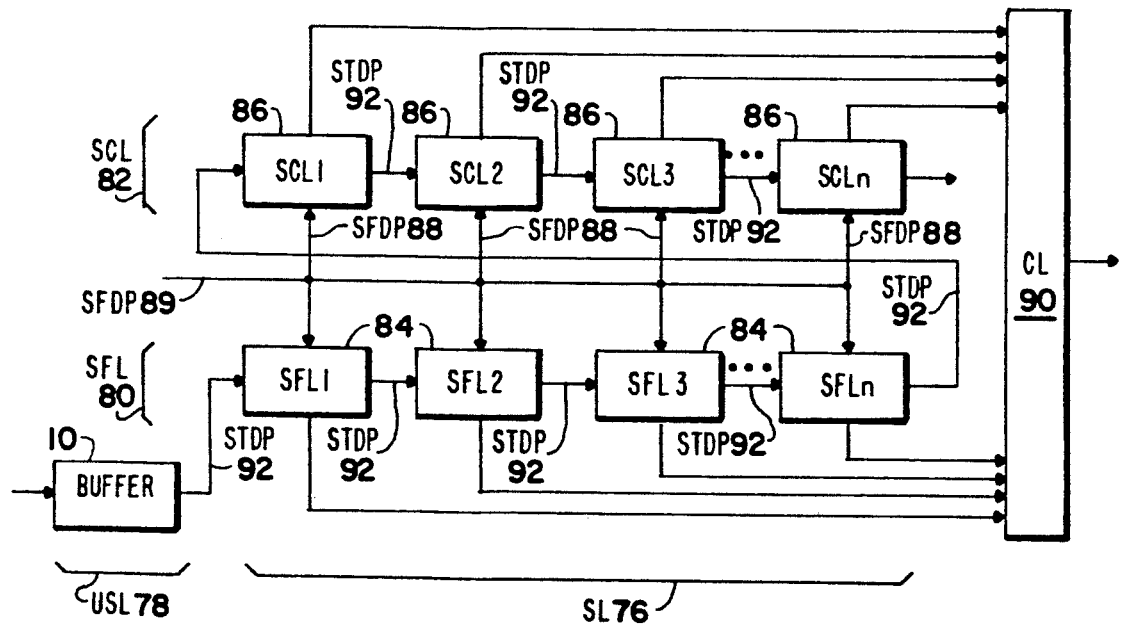
FIG. 3 is a block diagram of a system manager of the exemplary system.

Referring to FIG. 3, therein is presented a simplified block diagram of SMF 20. As shown, SMF 20 is essentially a general purpose central processing unit executing programs designed to perform specialized functions. Among these functions are system initialization and test, including the initial loading of microcode routines into the CSS 2s and the loading of Quality Logic Test (QLT) programs into the MM 12s and the execution of such QLT programs to test the proper operation of DPS 1 and detect errors or faults in the operations of the CSS 2s, MM 12s and other units of DPS 1.

SMF 20 includes a Microprocessor (UP) 56, which controls and performs the operations of SMF 20 under direction of programs stored in SMF 20's memory elements, and an Address Bus 58 and a Data Bus 60 connecting UP 56 and the other elements of SMF 20 for communication of data and instructions among the element of SMF 20.

The memory elements of SMF 20 include a Microprocessor Read Only Memory (UPROM) 62, which stores the programs directly controlling UP 56, that is, UP 56's microcode routines. Data used by and generated SMF 20 and certain programs controlling the operations of SMF 20 are stored in a Microprocessor Random Access Memory (UPRAM) 64, as is typical in most computer systems.

An Electronically Erasable Programmable Read Only Memory (E2PROM) 66 is provided for long term storage of certain programs and information which are to be permanently resident in SMF 20, unless deliberately erased or overwritten by the system user. Such programs would include the initialization program, or bootload program, for SMF 20, passwords and password programs for controlling access to DPS 1 and SMF 20, information identifying the Peripheral Device 14 storing the system initialization (boot) software, MM 12 locations assigned for specific functions, such as storing boot and QLT programs, information as to which test programs are to be executed and the results to be expected from such programs, and information as to which of Peripheral Devices 14 contain the programs or microcode for controlling CSS 2s.

E2PROM 66 will also store and provide test programs for the self test of SMF 20, the testing of System Bus 8, and testing of various device's interfaces with System Bus 8, such as the SBI 10 of CSS 2. The test programs also include programs for testing internal elements of, for example, the CPs 4 and the programs of the present invention.

Finally, a Boot and QLT Read Only Memory (BOOT/QLT ROM) 68 is provided to store programs for controlling operation of DPS 1 during initialization, such as a programs for controlling the initial loading, or booting, of software into DPS 1 and for selecting QLT programs to be executed at system initialization.

SMF 20 also includes a number of device controllers for controlling the peripheral devices of SMF 20, such as a Display Controller (DC) 70 for interfacing SMF 20 with Display Console 22, a Console Adapter Controller (CAC) 72 for interfacing SMF 20 to Console Adapter 24, and a Communications Controller (COMC) 74 for interfacing SMF 20 with Modem 28.

Finally, the elements of SMF 20 are connected, through A Bus 74 and D Bus 76, to System Bus 8 through an SBI 10, which may differ in detail from that previously described with reference to CSS 2 but which performs the same general functions with respect to bus operations. BOOT/QLT ROM 68 which, as described, stores programs for controlling the initialization and testing of other units of DPS 1, such as the CSS 2s and MM 12s, is connected directly through SBI 10 to System Bus 8.

SMF 20 will not, be described in further detail as the general structure and operation of such units in a system, are, in general, well known in the art and are described in detail in the referenced related patents.

Turning now to the present invention, "shadowing" is a well known method of fault detection and isolation wherein certain elements of, for example, a central processing unit, referred to as the "shadowed elements" are duplicated and the duplicate elements, referred to as the "shadow elements", operated in parallel with the shadowed elements. The information resident in the shadowed elements is copied into, that is, duplicated in, the shadow elements so that, at each point in time, the information contained in the two sets of elements is identical.

Fault detection circuitry compares the information resident in the shadowed elements to the copy of that information resident in the shadowing elements to detect differences between the two copies of the information that may be indicative of a fault in the shadowed elements. It is most usual, as in the present implementation of the present invention, for the shadowed elements to include registers of the logic circuitry to the "shadowed", as is illustrated in FIG. 3, as the registers of an element are the normal data storage elements. The registers may be used both to latch information during normal operation, as in making the shadow copy of the information resident in the shadowed elements, and, in fault isolation operations, to save the current state of the information in both the shadowed and shadow elements to be subsequently read out by fault analysis procedures.

Referring to FIG. 3, therein is shown a diagrammatic representation of the shadowed and shadow elements of, for example, the IUNIT 36 of a CP 4, which will be used to illustrate both shadowing and the present invention.

First considering the conventional use of shadowing as a means for fault monitoring in logic circuitry, as represented FIG. 3 a given functional unit may include both shadowed elements, represented as Shadowed Logic (SL) 76, and unshadowed elements, represented as Unshadowed Logic (USL) 78, which may, for example, be a string buffer register used in the following described integrity test. It should be noted that, while USL 78 is not central to the present discussion, such unshadowed portions of logic circuitry would normally be provided with some form of fault detection and isolation, such as parity checking of information resident therein or other fault detection procedures or apparatus designed for the specific logic circuitry to be tested.

The shadowed logic, SL 76, is comprised of the functional logic circuitry which is performing the actual data processing functions and is referred to in FIG. 3 as Shadowed Functional Logic (SFL) 80. The shadowing logic circuitry is identified as Shadow Copy Logic (SCL) 82. As was indicated above, the elements of the shadowed logic circuitry involved in the shadowing are usually comprised of the data registers of the data processing logic, which are indicated in FIG. 3 as SFL1 84 through SFLn 84. Each such register in SFL 80 is duplicated in SCL 82 by a corresponding Shadow Copy Logic register, identified in FIG. 3 as SCL1 86 through SCLn 86.

The input of each SFL 84 register is connected through a Shadow Parallel Data Path (SPDP) 88 to the input of its corresponding SCL 86 register, so that, at any given time, the information resident in any given SFL 84 register is equal with the information in the corresponding SCL 86 register. This is illustrated in FIG. 3 by the Shadowed Functional Data Path (SFDP) 89, which represents the normal data input paths into the shadowed registers. As shown, the functional data path into each SFL 84 register input is also connected into the input of the corresponding SCL 86 register through the corresponding SPDP 88 data path. The registers of SCL 82 are thereby connected in parallel with the registers of SFL 80 and always contain a shadow copy of the information contained in the registers SFL 80.

Data outputs of both the SCL 86 registers of SCL 82 and the SFL 84 registers of SFL 80 are connected in parallel to the inputs of Comparator Logic (CL) 90, so that CL 90 continuously compares the information being processed in the functional data processing elements of the unit being monitored, that is, the information in the SFL 84 registers, to the shadow copy of that information residing in the SCL 86 registers and, in general, detects and indicates any differences between the two sets of information that might be indicative of a fault or error in the functional data processing logic containing the SFL 84 registers.

It should be noted, in this respect, that, due to the complexity of the logic circuitry which is normally being monitored and the constraints on lead availability within a complex integrated circuit chip, the data outputs of the registers involved in the shadowing may not be directly available. The data outputs of the SFL 84 and SCL 86 registers may reach CL 90 through indirect paths. As such, whether any given bit in an SCL 86 register is visible, as received by CL 90, is influenced by many other factors. As an example, a given bit output from a register may pass through a multiplexer before being connected to CL 90 and, as such, that input to CL 90 may, depending upon certain external or internal control signals, actually be from another register bit position than is desired.

Because of this, CL 90 will normally not be able to see a number of mismatches between the information being processed, as received from the registers of SFL 80, and the shadow copy of that information, as received from the registers of SCL 82, even if either SFL 80 are SCL 82 in error or fault. CL 90 must therefore be understood to detect only mismatches in those signals available to the comparator and, in this case, they are the shadowed outputs of the chip and of the shadowing logic equivalent outputs.

Turning now to the present invention, it is apparent from FIG. 3 that, in the shadowing operation the data bits resident in the shadowed and shadowing registers are read from and written into the registers in parallel. Accordingly, the shadowed and shadowed registers as used in conventional shadowing are of the parallel-in/parallel-out type, that is, data bits may be written into and read from the registers in parallel and is copied from the shadowed registers to the shadowing registers in parallel. It should be noted, however, that some of the SFL 80 shadowed registers may, in their data processing functions, be serial-in/serial out registers, that is, data bits may be written into and read from the registers serially.

The method for testing the integrity of the fault monitoring logic of the present invention requires that both the shadowed registers of SFL 80 and the shadowing registers of SCL 82 be capable of serial-in/serial-out operation and adds a further data path to the registers illustrated in FIG. 3. This data path is indicated as Serial Test Data Paths (STDPs) 92, and connects the serial data inputs and outputs of the shadowed registers of SFL 80 and the shadowing registers of SCL 82 into a single serial chain of registers. It should be noted that parallel/serial registers, that is, registers capable of both parallel-in/parallel-out and serial-in/serial-out operation are well known in the art and readily available.

As will be described further below with reference to FIGS. 4 and 5, the fault monitoring integrity test of the present invention is performed at system power-up and under the control of SMF 20 which, as described, is capable or reading from and writing to the register of the elements in CP 4, such as IUNIT 36. The integrity test is performed by serially shifting, or scanning, known test patterns of bits through the serial scan chain comprised of the shadowed registers of SFL 80, the shadowing registers of SCL 82, and the serial data path comprised of STDPs 92, and monitoring the faults, or errors, detected by CL 90. As described below, there are two sets of test patterns. The first set of patterns are selected so that the test patterns themselves should not induce any errors to appear to the comparison logic so long as the the test logic is correct, so that any errors that are detected are due to a fault in the test logic. The second set of test patterns are selected to induce errors to appear as the patterns are shifted, bit by bit, through the scan chain. The first patterns thereby determine that there are not errors in the fault monitoring logic itself, and the second patterns that the fault monitoring logic is detecting errors correctly.

Figure 4:
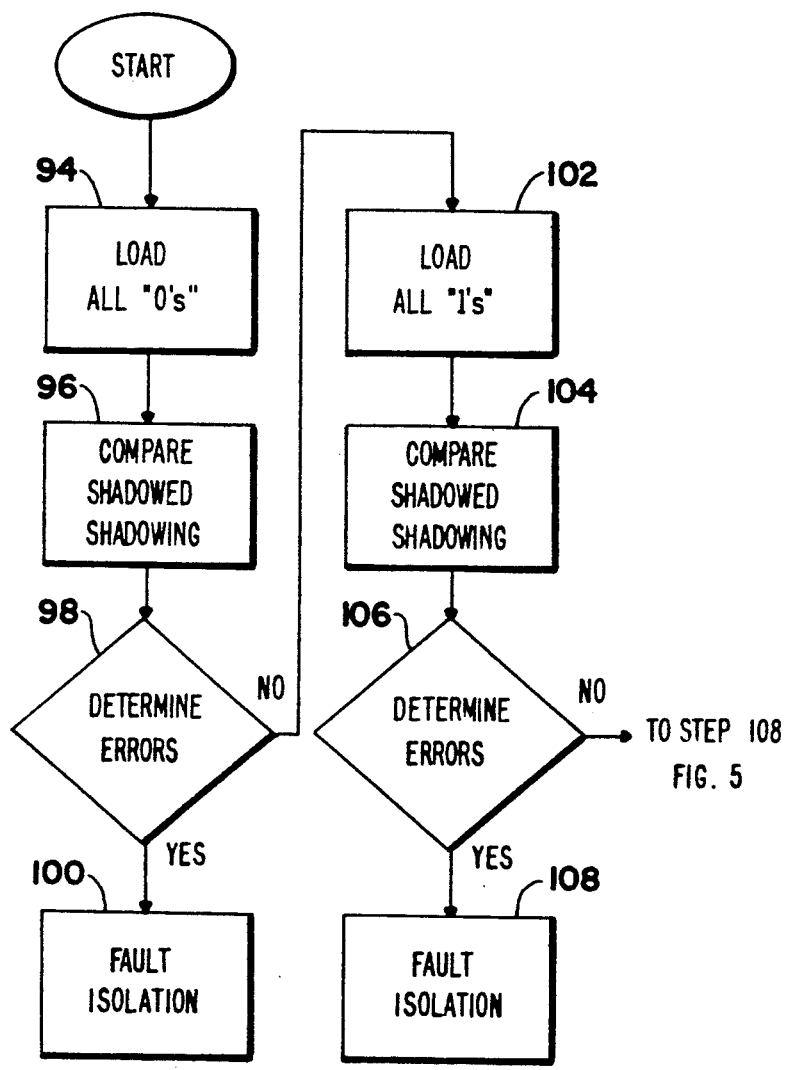
FIGS. 4 and 5 are a flow chart illustrating the present invention.
Figure 5:
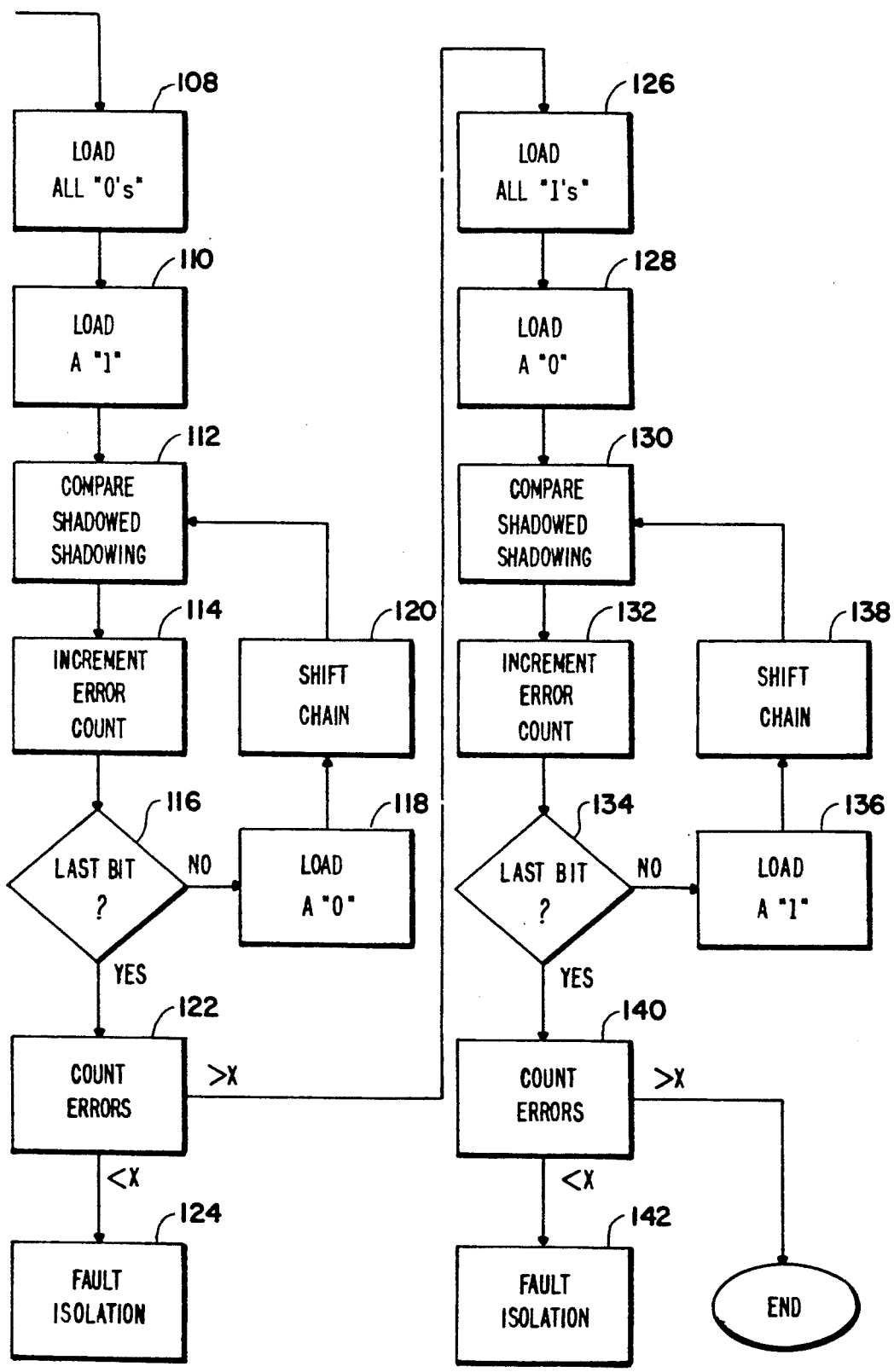

Referring to FIGS. 4 and 5, therein is illustrated the operation of the fault monitoring integrity test of the present invention. Each of FIGS. 4 and 5 contains a part of the procedure and together contain the entire procedure. As will be described, the integrity test is performed in four sequences of steps. In the first two, a test pattern of bits is shifted into the scan chain comprised of the shadowed and shadowing registers and the outputs of the registers compared to determine whether any errors have been detected.

The procedure begins at system initialization with Step 94, wherein series of all "0"s is written serially into the scan chain comprised of shadowed registers of SFL 80 and the shadowing registers of SCL 82, until the registers all contain "0"s. In Step 96, CL 90 compares the test bits read from the shadowed registers of SFL 80 with the test bits read from the shadowing registers of SCL 82 and, in Step 98, determines whether any errors have been detected between the contents of the shadowed and shadowing registers. If errors have been detected, the procedure goes to Step 100 and initiates the appropriate fault isolation procedures, which are generally well known in the art.

If no errors are detected, the procedure goes to Steps 102, 104 and 106, which essentially repeats the test procedure of Steps 94 through 98, but with all "1"s loaded into the shadowed and shadowing registers.

If no errors were detected in Step 106, the procedure goes to Step 108, wherein the shadowed and shadowing registers are loaded with all "0"s by serially shifting a chain of all "0"s into the scan chain.

Step 110 load a single "1" test bit into the first bit of the scan chain and the outputs of the shadowed and shadowing registers are compared by CL 90, in Step 112, to determine whether an error now appears from comparing the outputs of the shadowed and shadowing registers.

If an error is detected, an error count is incremented, in Step 114, and the procedure goes to Step 116, which determines whether the register bit presently containing the logic "1" test bit is the last bit of the scan chain, that is, and in the present example, in the bit of the last shadowing register SCL 86 of SCL 82.

If the test bit is not in the last bit of the scan chain, the procedure goes to Step 118, wherein a logic "0" is loaded into the first bit of the scan chain, and to Step 120, wherein the bits in the scan chain all all shifted by one bit towards the end of the scan chain. The second bit of the scan chain will now contain the "1" test bit, and the first bit of the scan chain and the third through final bits of the scan chain will contain "0"s.

The procedure then goes again to Step 112, to determine whether a comparison of the bits in the shadowed and shadowing portions of the scan chain shows any errors and increments the error counter if errors are detected, and then again to Step 116 to determine whether the test bit is in the last bit position of the scan chain.

The procedure will continue around the loop comprising Steps 116, 118, 120, 112 and 114 until the test bit appears in the last bit position of the scan chain. The procedure thereby shifts a test bit pattern consisting of a single logic "1" test bit and otherwise all "0"s through the entire scan chain of shadowed registers SFL 84 and shadowing registers SCL 86, examining the contents of the shadowed and shadowing registers at every position in which the test bit appears and counting the total number of errors detected during this operation.

When the test bit has been entirely shifted through the scan chain, and the last bit position has been reached by the test bit, the procedure branches to Step 122, where the total number of errors detected is compared to a predetermined number.

As was described, the purpose of shifting a test pattern comprised of a single "1" test bit in a continuous string of "0"s was to induce errors at each bit position in the scan chain, and to detect those errors. This test sequence could thereby result in an error detected for each bit position in the shadowed and shadowing registers.

As was also described, however, the comparison logic will normally not be able to see a number of mismatches between the information being processed, as received from the registers of SFL 80, and the shadow copy of that information, as received from the registers of SCL 82. For this reason, this final step in the first sequence using a test pattern designed to induce errors test that at least a minimum number of errors have been detected, rather than the total possible number of errors.

It should be noted that the first test sequences, those using bit patterns selected so as to not result in errors probably will not require a determination of whether the number of errors detected is greater than or less than a predetermined number because the probability of false errors is less when the test patterns are all comprised of "1"s or "0"s. If all the test bits in the shadowed and shadowing registers are the same, however, such an "error" in the bit input to CL 90 will be invisible.

In the event that false errors appear when the all "0"s or all "1"s test patterns are used, however, the approach used for the single "1" or single "0" patterns, that of comparing the number of detected "errors" to a predetermined number may be used to "filter out" the false errors. In the case of the all "0"s and all "1"s test patterns, however, which are selected so as to not, in themselves cause error indications, the test would be whether the number of detected errors exceeds a given limit, rather than whether the number of errors detected is less than a given limit.

Returning to consideration of the test patterns selected to induce error responses, if the error count has indicated that the minimum number of errors has not been detected, the procedure will branch to Step 124 for the appropriate fault isolation procedures.

If the error count has indicated that at least the minimum number of errors has been detected then it is concluded that the test logic is operating correctly and the procedure branches to the sequence of steps comprising Steps 126 through 142.

Steps 126 through 142 essentially perform the same test as Steps 108 through 124, but with a test pattern comprised of a single logic "0" test bit in a string of otherwise all logic "1" bits, and again determines whether the minimum number of errors has been detected.

While the invention has been particularly shown and described with reference to a preferred embodiment of the method thereof, it will be understood by those of ordinary skill in the art that various changes in form, details and implementation may be made therein without departing from the spirit and scope of the invention as defined by the appended claims. For example, the order in which the test patterns are used may differ and the specific structure of shadowed and shadowing registers may differ from that shown, for example, the shadowing registers may appear "upstream" in the scan chain from the shadowed registers, or the shadowed and shadowing registers may be interleaved along the scan chain.

What is claimed is:

1. In a data processing system having a data processing unit, the data processing unit including data processing logic including shadowed functional registers for storing the data being processed and fault monitoring logic for detecting faults in the data processing logic, the fault monitoring logic including, for each shadowed register, a shadowing copy register connected in parallel from the corresponding shadowed register to receive and store a copy of the data written into the shadowed register and comparison logic connected from the shadowed and shadowing registers for comparing the data resident in the shadowed and shadowing registers and providing indications of possible faults in the data processing loci, a method for testing the integrity of the fault monitoring logic, comprising the steps of:
   connecting the shadowed and shadowing registers in a serial scan chain through a serial scan data path,
   shifting a test pattern of bits through the scan chain of shadowed and shadowing registers,
   in the comparison logic, determining errors appearing from a comparison of the test pattern bits in the shadowed and shadowing registers, and
   from the errors detected by the comparison logic, determining whether the fault monitoring logic is operating correctly.

2. The method of testing the integrity of fault monitoring logic of claim 1, wherein:
   the test pattern is selected so that the test pattern induces no errors to appear in the comparison of the bits in the shadowed and shadowing registers.

3. The method of testing the integrity of fault monitoring logic of claim 1, wherein:
   the test pattern is selected so that the test pattern induces errors to appear in the comparison of the bits in the shadowed and shadowing registers.

4. The method of testing the integrity of fault monitoring logic of claim 2, wherein:
   the test pattern is selected to be a string of all logic 0s.

5. The method of testing the integrity of fault monitoring logic of claim 2, wherein:
   the test pattern is selected to be a string of all logic 1s.

6. The method of testing the integrity of fault monitoring logic of claim 3, wherein:
   the test pattern is selected to be a string of logic 0s containing a single logic 1 bit and is shifted sequentially through the entire scan chain.

7. The method of testing the integrity of fault monitoring logic of claim 3, wherein:
   the test pattern is selected to be a string of logic 1s containing a single logic 0 bit and is shifted sequentially through the entire scan chain.

8. In a data processing system having a data processing unit, the data processing unit including data processing logic including shadowed functional registers for storing the data being processed and fault monitoring logic for detecting faults in the data processing logic, the fault monitoring logic including, for each shadowed register, a shadowing copy register connected in parallel from the corresponding shadowed register to receive and store a copy of the data written into the shadowed register and comparison logic connected from the shadowed and shadowing registers for comparing the data resident in the shadowed and shadowing registers and providing indications of possible faults in the data processing logic, means for testing the integrity of the fault monitoring logic, comprising:

a serial data path connecting the shadowed and shadowing registers in a serial scan chain, means for loading and shifting a test pattern of bits through the scan chain of shadowed and shadowing registers, and in the comparison logic, means for determining errors appearing from a comparison of the test pattern bits in the shadowed and shadowing registers, and from the errors detected by the comparison logic, determining whether the fault monitoring logic is operating correctly.

9. The means of testing the integrity of fault monitoring logic of claim 8, wherein:

the test pattern is selected so that the test pattern induces no errors to appear in the comparison of the bits in the shadowed and shadowing registers.

10. The method of testing the integrity of fault monitoring logic of claim 8, wherein:

the test pattern is selected so that the test pattern induces errors to appear in the comparison of the bits in the shadowed and shadowing registers.

11. The method of testing the integrity of fault monitoring logic of claim 9, wherein:

the test pattern is selected to be a string of all logic 0s.

12. The method of testing the integrity of fault monitoring logic of claim 9, wherein:

the test pattern is selected to be a string of all logic 1s.

13. The method of testing the integrity of fault monitoring logic of claim 10, wherein:

the test pattern is selected to be a string of logic 0s containing a single logic 1 bit and is shifted sequentially through the entire scan chain.

14. The method of testing the integrity of fault monitoring logic of claim 10, wherein:

the test pattern is selected to be a string of logic 1s containing a single logic 0 bit and is shifted sequentially through the entire scan chain.

* * * * *